(12) United States Patent
Cyr

(10) Patent No.: US 9,786,332 B2
(45) Date of Patent: Oct. 10, 2017

(54) SEMICONDUCTOR DEVICE PACKAGE WITH MIRROR MODE

(71) Applicant: Micron Technology, Inc., Boise, ID (US)

(72) Inventor: Scott R. Cyr, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 209 days.

(21) Appl. No.: 14/624,298

(22) Filed: Feb. 17, 2015

(65) Prior Publication Data

US 2016/0240227 A1    Aug. 18, 2016

(51) Int. Cl.
| | |
|---|---|
| *G06F 17/50* | (2006.01) |
| *G11C 5/02* | (2006.01) |
| *H01L 25/00* | (2006.01) |
| *G11C 5/06* | (2006.01) |
| *G11C 8/12* | (2006.01) |
| *H01L 25/065* | (2006.01) |

(52) U.S. Cl.
CPC .............. *G11C 5/025* (2013.01); *G11C 5/066* (2013.01); *G11C 8/12* (2013.01); *H01L 25/0657* (2013.01); *H01L 25/50* (2013.01); *H01L 2224/16225* (2013.01); *H01L 2225/06517* (2013.01); *H01L 2225/06527* (2013.01); *H01L 2225/06572* (2013.01)

(58) Field of Classification Search
USPC ................................................ 716/137, 138
See application file for complete search history.

(56) References Cited

U.S. PATENT DOCUMENTS

| | | | | |
|---|---|---|---|---|
| 6,278,264 | B1* | 8/2001 | Burstein | H01L 23/5386 257/700 |
| 2007/0007642 | A1* | 1/2007 | Tajika | H01L 23/5286 257/691 |
| 2013/0063998 | A1* | 3/2013 | Harashima | G11C 5/04 365/63 |
| 2014/0110711 | A1* | 4/2014 | Gorman | G01R 31/318513 257/48 |
| 2014/0192583 | A1* | 7/2014 | Rajan | G11C 7/10 365/63 |
| 2015/0318627 | A1* | 11/2015 | Berry, Jr. | H01R 12/7076 714/6.32 |

* cited by examiner

*Primary Examiner* — Brian Ngo
(74) *Attorney, Agent, or Firm* — Perkins Coie LLP

(57) ABSTRACT

Semiconductor device assemblies with semiconductor device packages configured to operate in mirror mode are disclosed herein. In one embodiment a semiconductor device assembly includes a first semiconductor device package attached to a front side of a support substrate, and a second semiconductor device package attached to a back side of the support substrate. The first device package includes a plurality of first package contacts having a first arrangement of corresponding pin assignments, and the second device package includes a plurality of second package contacts and a switch circuit operably coupled to the second package contacts. The switch circuit is configured to receive a switch signal via the support substrate, and to assign the second package contacts to either the first arrangement of corresponding pin assignments or a second arrangement of corresponding pin assignments based on the switch signal.

20 Claims, 6 Drawing Sheets

SEMICONDUCTOR DEVICE PACKAGE WITH MIRROR MODE

TECHNICAL FIELD

The disclosed embodiments relate to semiconductor device packages, and in particular to memory device packages configured to operate in mirror mode.

BACKGROUND

A memory device package typically includes a semiconductor memory die encased in a plastic or ceramic casing, and package contacts that enable the device package to be electrically connected to a printed circuit board (PCB). As shown in FIG. 1A, a memory device assembly 100a has multiple memory device packages 102 mounted to a PCB 104. Each of the memory device packages 102 includes package contacts 106 having a pin assignment 107. The PCB 104 includes metal traces 108 (shown schematically) that electrically interconnect the address pins A[2], A[8], A[7], and A[9] on one of the memory device packages 102 to the same address pin on the other. The traces 108 also connect the address pins to a memory controller device (not shown) mounted to the PCB 104.

FIG. 1B shows a memory device assembly 100b in which the memory device packages 102 are attached to opposite sides of the PCB 104. In this type of assembly, the traces 108 are located on both sides of the PCB 104, and can be interconnected by vias (not shown) that extend through the board. One advantage of the assembly 100b is that it has a reduced footprint since both memory device packages 102 are located generally within the same planform area of the board. A challenge with assembly 100b, however, is that since the lower device package is flipped upside down, its address pins are arranged in the reverse order of the address pins of the upper device package. Consequently, the traces that interconnect each pair of corresponding outer address pins A[7] and A[8] are relatively longer than the traces that connect each pair inner address pins A[2] and A[9]. The longer traces accordingly have a larger electrical resistance, and this can reduce signal quality. Additionally, the longer traces can cause timing skew, since they have a longer signal path than the shorter traces.

DETAILED DESCRIPTION

Specific details of various embodiments of memory devices packages with mirror mode are described herein, along with related methods, devices, and systems. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to one or more semiconductor devices that are incorporated into a common package. A semiconductor package can include a housing or casing that partially or completely encapsulates the semiconductor device(s). A semiconductor device package can also include an interposer substrate that carries one or more semiconductor devices and is attached to or otherwise incorporated into the package. The term "semiconductor device assembly" can refer to an assembly of one or more semiconductor devices, semiconductor device packages, and/or substrates (e.g., interposer, support, or other suitable substrates).

In the illustrated embodiments described below, semiconductor assemblies and device packages are described in the context of memory device packages and memory device assemblies that include such packages. The invention, however, is not limited to memory devices. For example, some embodiments of semiconductor device assemblies and packages can include processors, logic dies, light-emitting dies, analog circuit dies, etc. Further, a person skilled in the relevant art will also understand that the new technology may have additional embodiments and that the technology may be practiced without several of the details of the embodiments described below with reference to FIGS. 2A-5.

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
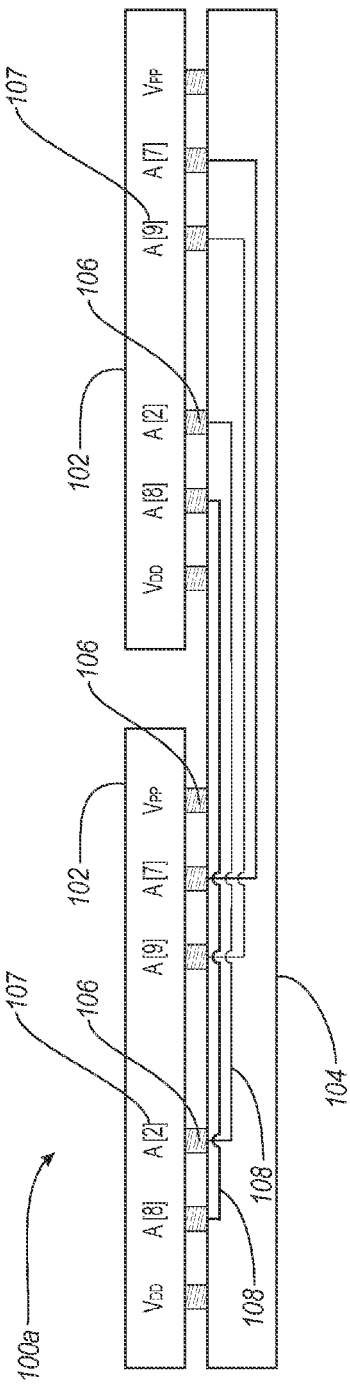
FIGS. 1A and 1B are cross-sectional views of memory device assemblies in accordance with prior art.
Figure 1B:
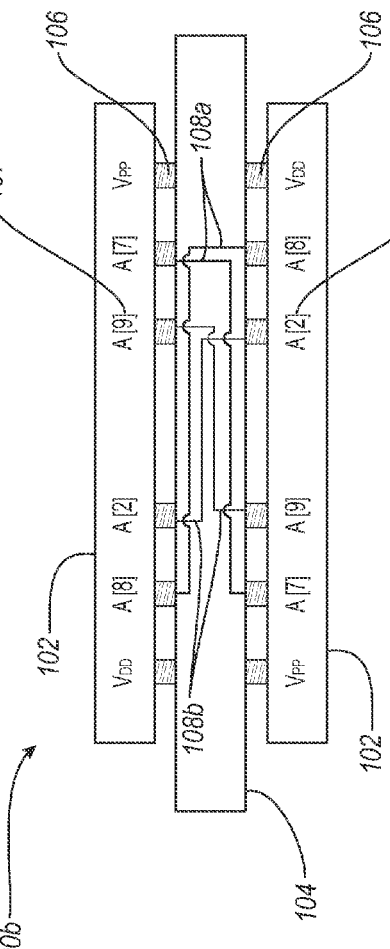
Figure 2A:
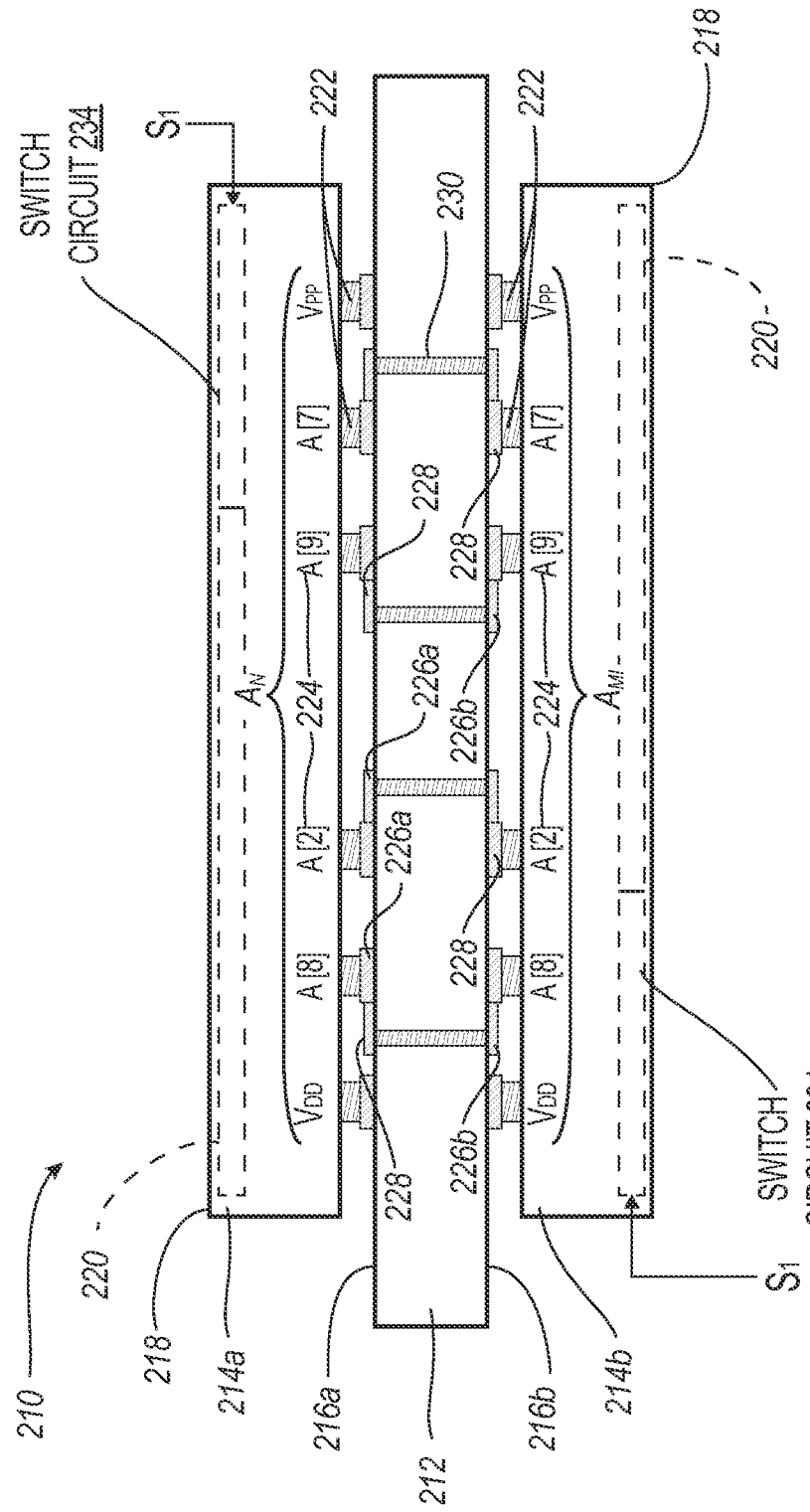
FIG. 2A is a cross-sectional view of a semiconductor device assembly in accordance with embodiments of the present technology.

FIG. 2A is a cross-sectional view of a semiconductor device assembly 210 ("assembly 210") in accordance with embodiments of the present technology. As shown, the assembly 210 includes a support substrate 212 (e.g., a printed circuit board), a first memory device package 214a ("upper device package 214a") attached to a front side 216a of the substrate 212, and a second memory device package 214b ("lower device package 214b") attached to a back side 216b of the substrate 212. The device packages 214a-b each include a casing 218, at least one memory die 220 within the casing 218, and a plurality of package contacts 222 having corresponding pin assignments 224 designating the unique signal that is to be received at a particular one of the contacts. In at least some embodiments, the upper and lower devices 214a-b can be identical. In one embodiment, the memory die can include a DRAM die containing NAND-based memory, while in other embodiments the memory die can include other types of memory, such as NOR-based memory or magnetoresistive memory.

As further shown in FIG. 2A, the memory dies 220 of the device packages 214a-b each include a switch circuit 234 configured to receive a switch signal $S_1$ having a predetermined signal value (e.g., a predetermined voltage level.). In the example of FIG. 2A, the switch circuit 234 is configured to assign the package contacts 222 to either a normal arrangement, $A_N$, of pin assignments 224 or a mirrored arrangement, $A_{MI}$, of pin assignments based on whether the switch signal $S_1$ is low (e.g., logic low or circuit ground) or high (e.g., logic high or $V_{DD}$). When the switch signal $S_1$ is low, the switch circuit 234 will assign the package contacts 222 of a particular memory device package to the normal arrangement $A_N$, and the device package will operate in "normal mode." When the switch signal $S_1$ is high, the switch circuit 234 will assign the package contacts 222 to the mirrored arrangement $A_{MI}$, and the device package will operate in mirror mode. In mirror mode, the pin assignments 224 are arranged such that they are a mirror image of the pin assignments of the normal arrangement $A_N$ of pin assignments. In the embodiment shown in FIG. 2A, when the assembly 210 is powered on, the lower device package 214b is in mirror mode and the upper device package 214a is in normal mode. In an alternate embodiment, the switch circuit 234 can be configured to toggle a memory device package into mirror mode when the switch signal $S_1$ is low and into normal mode when the switch signal $S_1$ is high. In yet another embodiment, the switch circuit 234 can toggle a memory device package into mirror mode when it detects a certain amount of electrical current and/or electrical impedance at the input of the switch. For example, in one embodiment, the switch circuit 234 can toggle a memory device package into memory mode when it detects that it is connected to a resistive shunt.

As further shown in FIG. 2A, the support substrate 212 includes a plurality of first conductive traces 226a at the front side 216a, a plurality of second conductive traces 226b at the back side 216, and individual vias 230 extending through the substrate 212 and interconnecting the first traces 226a with the second traces 226b. The individual traces 226a-b can terminate in a bond pad 228 that electrically connects an individual trace to one of the package contacts 222 of either the upper device package 214a or the lower device package 214b.

Figure 2B:
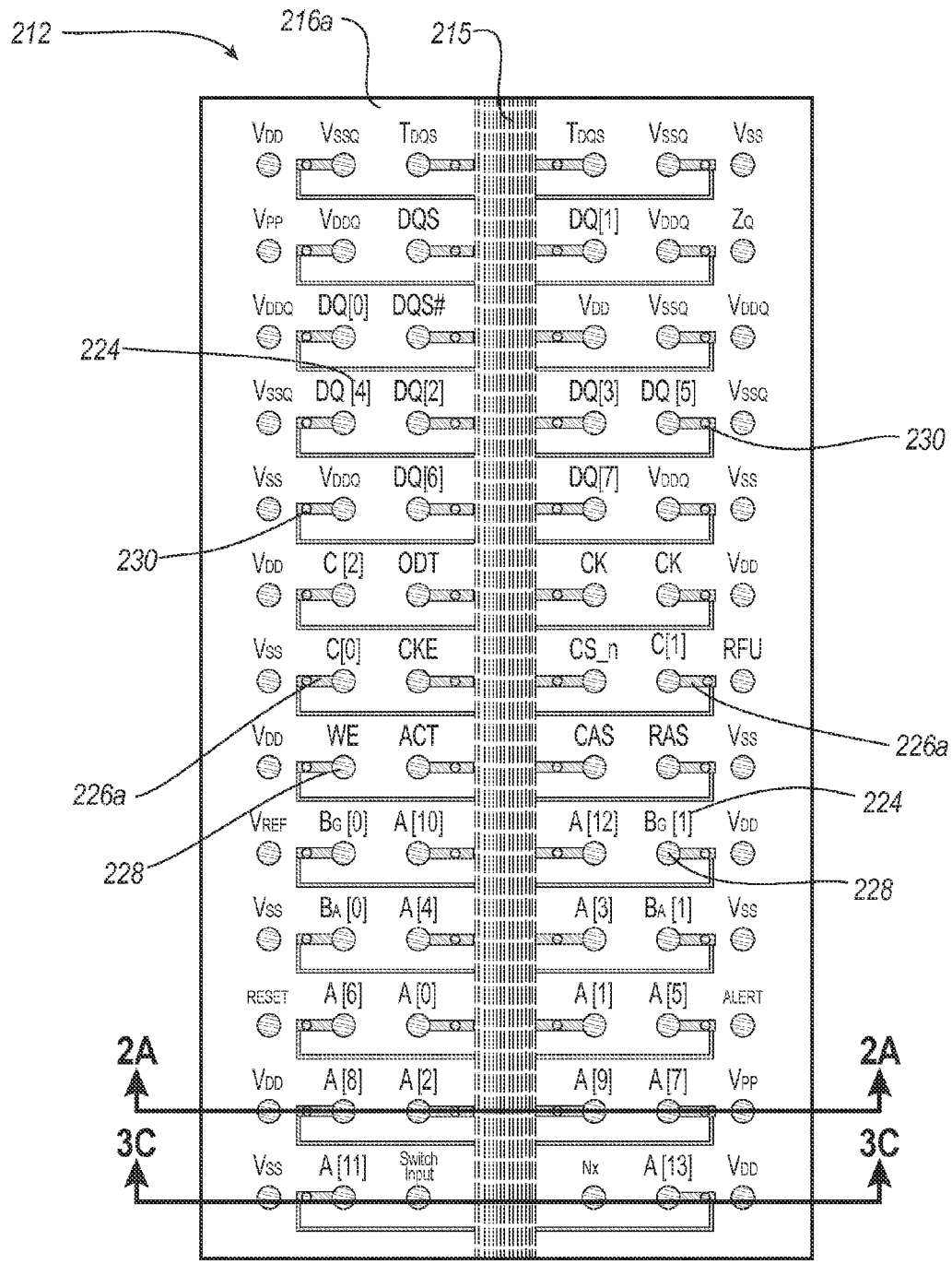
FIG. 2B is a top plan view showing a front side of a support substrate of the semiconductor device assembly of FIG. 2A.

FIG. 2B is a top plan view of a support substrate 212. Each of the first traces 226a branch away from a main trace (not shown) extending along the center of the substrate 212 and/or or at either side of the substrate, and terminates at corresponding one of the bond pads 228. The individual bond pads 228 can correspond to a particular pin assignment, such as an address, bank address, command, control, I/O, voltage reference, or other pin assignment. The layout of the second traces 226b at the back side 216b of the substrate 212 can be generally similar to the layout of the first traces 226a shown in FIG. 2A. In one embodiment, the trace layouts on the front and back sides 216a and 216b can be a mirror image of one another.

Referring back to FIG. 2A, as noted above, the switch circuit 234 can program a memory device package into either a normal mode or a mirrored mode. One advantage of this capability is that it can reduce the complexity of trace layout compared to conventional assemblies. For example, when the pin assignments 224 of the lower device package 214b are mirrored, they are directly below the same pin assignments 224 of the upper device package 214a. Accordingly, relatively short traces 226a-b can be used to connect each pair of corresponding outer package contacts 222 (e.g., address pins A[8] and A[7]). By contrast, conventional device assemblies have pin assignments that are in reverse order, and this requires relatively longer traces to interconnect each pair of the outermost package contacts of the upper and lower device packages. Accordingly, semiconductor device assemblies configured in accordance with the various embodiments of the present technology have reduced electrical impedance and improved signal quality compared to conventional assemblies. Further, the traces used to interconnect the outer package contacts (e.g., address pins A[8] and A[7]) can be similar in length to the traces used to interconnect the inner package contacts (e.g., address pins A[2] and A[9]). This, in turn, can reduce or eliminate timing skew in the assembly 210. In some embodiments, the mirror mode capability of the assembly 210 can enable some or all of the traces to be eliminated altogether. For example, in such embodiments, the bond pads 228 at the top side can be coupled to underlying bond pads at the bottom side 216b by via-in-pad connections 227 (shown in hidden lines).

Figure 3A:
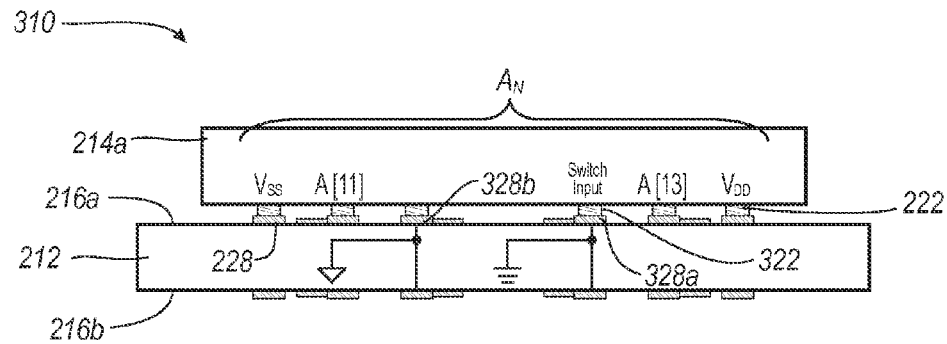
FIGS. 3A-3C are cross-sectional views illustrating a method of manufacturing a memory device assembly in accordance with embodiments of the present technology.
Figure 3B:
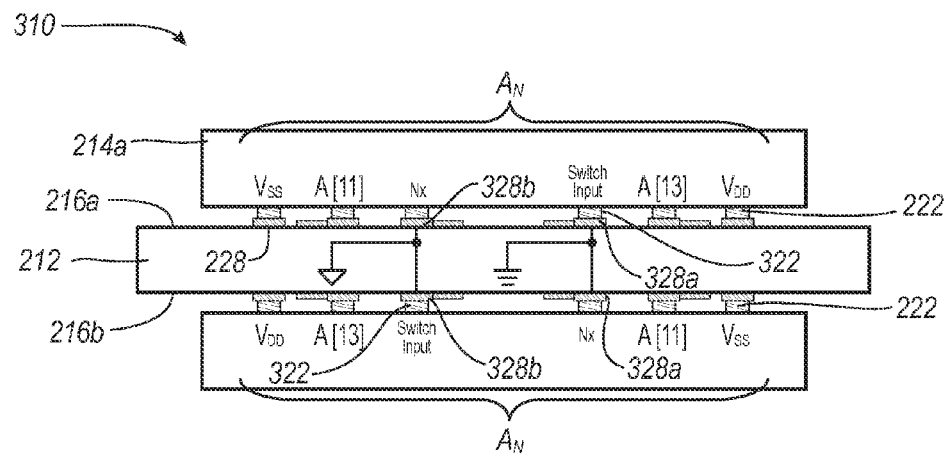
Figure 3C:
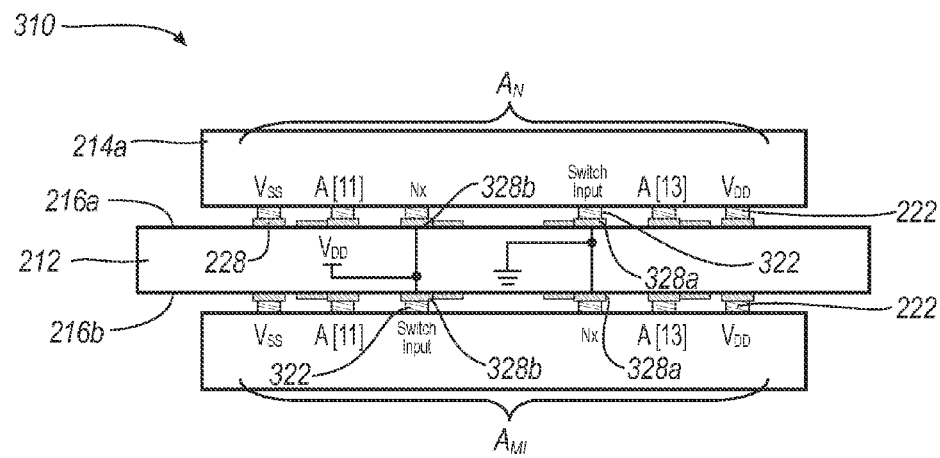

FIGS. 3A-3C are cross-sectional views illustrating aspects of a method of manufacturing the assembly 210 in accordance with embodiments of the present technology. Referring first to FIG. 3A, the upper device package 214a has been attached to the front side 216a of the support substrate 212 such that its package contacts 222 are bonded to individual bond pads 228 via, e.g., metal solder (not shown). As shown, one of the package contacts 222 is designated as a switch input contact 322. In the embodiment illustrated in FIGS. 3A-3C, the switch input contact 322 retains the same pin assignment regardless of whether the memory device package is in mirror mode or normal mode. The switch input contact 322 is connected to the switch circuit 234 (FIG. 2A) inside the upper device package 214a. In the example of FIG. 3A, the switch input contact 322 is coupled to a first bond pad 328a which is connected to circuit ground. Accordingly, the upper device package 214a is programmed into normal mode, $A_N$, since the switch signal is low.

FIG. 3B shows the semiconductor device 310 after the lower device package 214b has been attached to the back side 216b of the support substrate 212 such that its package contacts 222 are bonded to individual bond pads 228. Similar to the upper device package 214a, the lower device package 214b includes a package contact designated as a switch input contact 322 and coupled to the switch circuit 234 inside the lower device package 214b. As shown, the switch input contact 322 for the lower device package 214b is connected to a second bond pad 328b that is at a floating potential when the support substrate is powered down. Accordingly, the switch signal $S_1$ is low, and the lower device package 214b is programmed into normal mode.

FIG. 3C shows the semiconductor device 310 after the support substrate 212 has been connected to a power supply (not shown) and powered on. When the support substrate 212 is powered on, the second bond pad 328b outputs a power supply voltage $V_{DD}$ to the switch input contact 322 which causes the switch circuit 234 to toggle the lower device package 214b into mirror mode. When powered off, the second bond pad 328b will return to a floating potential (FIG. 3B), and the lower device package 214b will revert back to normal mode.

Figure 4:
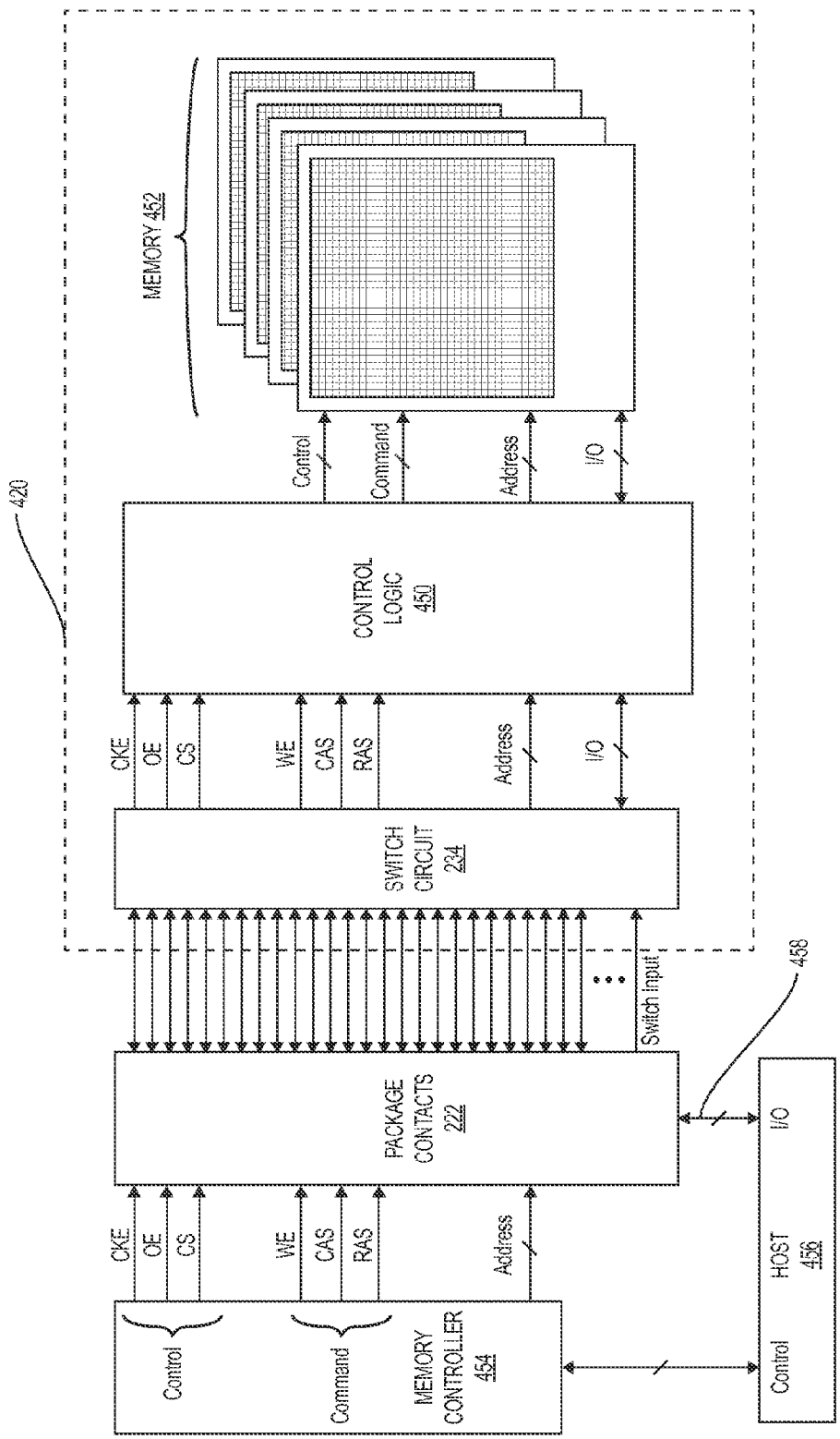
FIG. 4 is a schematic diagram of a memory die in accordance with embodiments of the present technology.

FIG. 4 is a schematic diagram of a memory die 420 in accordance with embodiments of the present technology. As shown, the memory die 420 includes control logic 450 coupled to the switch circuit 234, and one or more banks of memory arrays 452 ("memory 452") operably coupled to the control logic 450. The control logic 450 can include, for example, one or more multiplexers, decoders, buffers, read/write drivers, address registers, data out/data in registers, etc. The switch circuit 234 can include, for example, a multiplexer circuit. As further shown in FIG. 4, the switch circuit 234 is coupled to the package contacts 222, and the package contacts 222 are connected to a memory controller 454 and an upstream host device 456 (e.g., a central processor unit). The memory controller 454 is also connected to the host device 456. In one embodiment, the memory controller 454 can be mounted to the support substrate 212 (FIG. 2A).

In operation, the memory controller 454 receives read/write requests from the host device 456 that enable the host device to read/write data to specific locations in the memory 452 over an I/O bus 458. In response to the host requests, the memory controller 454 sends various signals to the control logic 450. These signals can include, for example, control, command, address, and other signals (e.g., clock signals). The control signals can include, for example, clock enable (CE), on die termination (ODT), and chip select (CS); the command signals can include, for example, write enable (WE), column address strobe (CAS), and row address strobe (RAS); and the address signals can include, for example, column address, row address, and bank address signals.

When the switch circuit 234 switches the memory die 420 from normal mode to mirror mode, some or all of the pin assignments may be assigned to different package contacts. In at least some embodiments, a pin for a certain control signal (e.g., a CE signal) might be reassigned to (1) a pin for a different control signal (e.g., a CS signal), (2) a pin for a command signal (e.g., a WE signal), (3) a pin for an address signal, or (4) a pin for an I/O signal. In one aspect of the illustrated embodiment of FIG. 4, the memory die 420 can handle mirror mode operations without requiring any intervention from the memory controller 454 or the host device 456. Rather, the memory die 420 can use the switch signal $S_1$ to recognize whether it is operating in mirror mode. In one embodiment, this enables the upper and lower devices 214a-b (FIG. 2A) to share the same traces for the control signals (e.g., CE, ODT, and CS lines) during load mode. For example, the memory die 420 of the lower device package 214b can disregard any load mode signals intended for the upper device package 214a (and vice versa). Conventional memory device packages, by contrast, cannot recognize whether they are in mirror mode, and therefore require two sets of dedicated control lines, one for the upper device package and the other for the lower device package. For example, the upper and lower device packages can each require their own dedicated lines for CE, OE, and CS signals.

Figure 5:
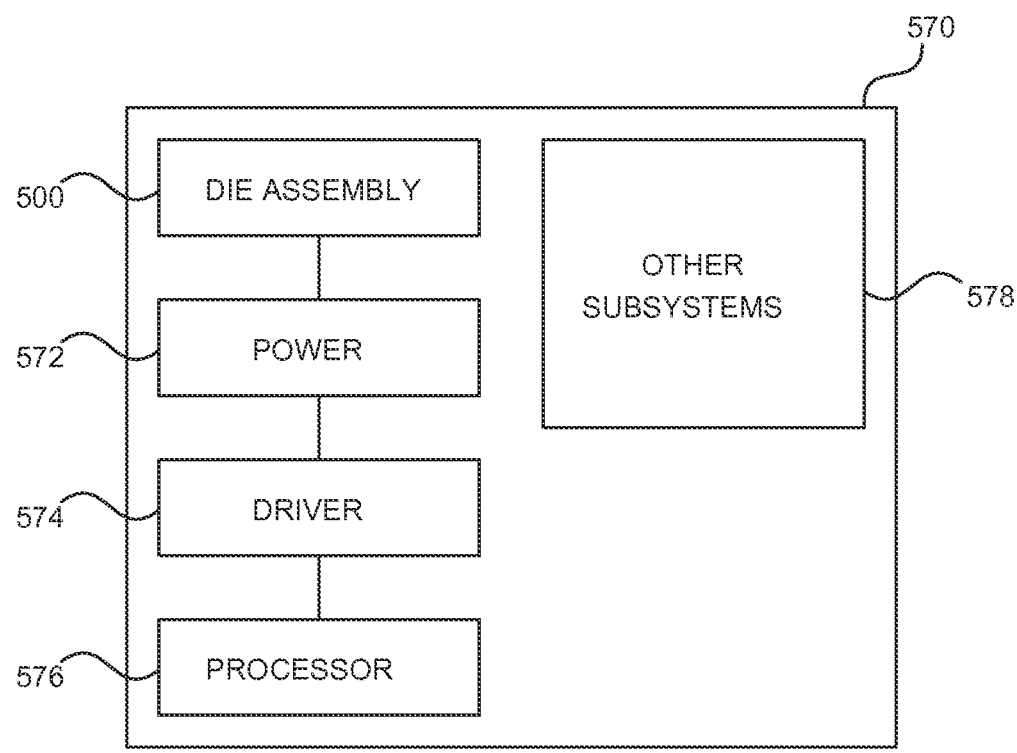
FIG. 5 is a schematic view of a system that includes a semiconductor device in accordance with embodiments of the present technology.

Any one of the semiconductor devices described above with reference to FIGS. 1-4 can be incorporated into any of a myriad of larger and/or more complex systems, a representative example of which is system 570 shown schematically in FIG. 5. The system 570 can include a semiconductor device 500, a power source 572, a driver 574, a processor 576, and/or other subsystems or components 578. The semiconductor device 500 can include features generally similar to those of the semiconductor devices described above, and can therefore include various features that enhance heat dissipation. The resulting system 570 can perform any of a wide variety of functions such as memory storage, data processing, and/or other suitable functions. Accordingly, representative systems 570 can include, without limitation, hand-held devices (e.g., mobile phones, tablets, digital readers, and digital audio players), computers, vehicle and other machines and appliances. Components of the system 570 may be housed in a single unit or distributed over multiple, interconnected units (e.g., through a communications network). The components of the system 570 can also include remote devices and any of a wide variety of computer readable media.

From the foregoing, it will be appreciated that specific embodiments of the technology have been described herein for purposes of illustration but that various modifications may be made without deviating from the disclosure. For example, in some embodiments, only a certain number of the pin assignments may be mirrored when a device package is put into mirror mode. In one embodiment, for example, the voltage pins of the memory device packages may not be mirrored when a device package is in mirror mode. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A semiconductor device assembly, comprising:
a support substrate having a front side and a back side;
a first semiconductor device package attached to the support substrate at the front side, the first semiconductor device package including a first semiconductor die having a plurality of pins, and including a plurality of first package contacts having a first arrangement of pin assignments corresponding to the pins of the first semiconductor die; and
a second semiconductor device package attached to the support substrate at the back side, and including—
a second semiconductor die having a plurality of pins,
a plurality of second package contacts, and
a switch circuit operably coupled to the second package contacts,
wherein the switch circuit is configured to—
receive a switch signal via the support substrate, and
assign the second package contacts to an arrangement of pin assignments corresponding to pins of the second semiconductor die, wherein the arrangement of pin assignments is either the first arrangement of pin assignments or a second arrangement of pin assignments based on the switch signal.

2. The semiconductor device assembly of claim 1 wherein the second arrangement of pin assignments is a mirror image of the first arrangement of pin assignments.

3. The semiconductor device assembly of claim 1 wherein the second semiconductor die includes the switch circuit.

4. The semiconductor device assembly of claim 1 wherein the switch circuit is further configured to assign the second package contacts to the second arrangement of pin assignments when the support substrate is powered on.

5. The semiconductor device assembly of claim 1 wherein the switch circuit is further configured to assign one of the second package contacts to either a pin assignment for a control signal or a pin assignment for a different control signal based on the switch signal.

6. The semiconductor device assembly of claim 5 wherein the control signal is a clock enable signal, an on die termination signal, or a chip select signal.

7. The semiconductor device assembly of claim 1 wherein the switch circuit is further configured to assign one of the second package contacts to either a pin assignment for a control signal or a pin assignment for a command signal based on the switch signal.

8. The semiconductor device assembly of claim 7 wherein:
the control signal is a clock enable signal, an on die termination signal, or a chip select signal; and the command signal is a write enable signal, a column address strobe signal, or a row address strobe signal.

9. The semiconductor device assembly of claim 1 wherein the switch circuit is further configured to assign one of the second package contacts to either a pin assignment for a control signal or a pin assignment for an address signal based on the switch signal.

10. The semiconductor device assembly of claim 1 wherein the first semiconductor device package is identical to the second semiconductor device package.

11. A memory device package, comprising:
   a first package contact configured to receive a switch signal;
   a plurality of second package contacts; and
   a memory die coupled to the first and second package contacts, the memory die configured to assign the second package contacts to either a first arrangement of corresponding pin assignments or a second arrangement of corresponding pin assignments based on the switch signal.

12. The memory device package of claim 11 wherein the second arrangement of corresponding pin assignments is a mirror image of the first arrangement of corresponding pin assignments.

13. The memory device package of claim 11 wherein the memory die includes one or more arrays of memory and a switch circuit operably coupling the second package contacts to the one or more arrays of memory.

14. The memory device package of claim 13 wherein the switch circuit includes a multiplexer.

15. The memory device package of claim 11 wherein the pin assignments comprise a plurality of control signals, including clock enable, on die termination, and chip select assignments.

16. A method of manufacturing a memory device assembly, the method comprising:
   attaching first package contacts of a first semiconductor device package to a first side of a support substrate, the first package contacts assigned to a first arrangement of pin assignments corresponding to pins of a first semiconductor die;
   attaching second package contacts of a second semiconductor device package to a second side of a support substrate opposite the first side, the second package includes a switch circuit configured to receive a switch signal and to assign the second package contacts to an arrangement of pin assignments corresponding to pins of a second semiconductor die, wherein the arrangement of pin assignments is to either the first arrangement of pin assignments or a second arrangement of pin assignments based on the switch signal; and
   bonding a third package contact of the second semiconductor device package to a bond pad configured to provide the switch signal.

17. The method of claim 16 wherein the second arrangement of pin assignments is a mirror image of the first arrangement of pin assignments.

18. The method of claim 16 wherein the signal is provided at the bond pad when the support substrate is powered on.

19. The method of claim 16 wherein the first semiconductor device package is identical to the second semiconductor device package.

20. The method of claim 16 when the pin assignments include control signal, command signal, and address signal pin assignments.

* * * * *